United States Patent [19]

Ottone

[11] 4,352,067
[45] Sep. 28, 1982

[54] BATTERY ANALYZER

[75] Inventor: Robert J. Ottone, Newtown, Conn.

[73] Assignee: DC Electronic Industries, Inc., Wharton, N.J.

[21] Appl. No.: 155,680

[22] Filed: Jun. 2, 1980

[51] Int. Cl.³ .............................................. G01N 27/42
[52] U.S. Cl. ..................................... 324/434; 324/429
[58] Field of Search ............... 324/426, 427, 429, 434; 340/636; 364/483

[56] References Cited

U.S. PATENT DOCUMENTS 3,586,962  6/1971  Rebstock .............................. 324/434
3,876,931  4/1975  Godshalk ............................. 324/429
3,899,732  8/1975  Staby .................................. 324/429

Primary Examiner—Michael J. Tokar
Attorney, Agent, or Firm—Oldham, Oldham, Hudak & Weber Co.

[57] ABSTRACT

A battery analyzer for testing industrial batteries under a constant current load. The analyzer includes a load bank consisting of a plurality of resistors in selective parallel interconnection. The load bank is placed across the battery terminals. Sensors are connected to each of the cells of the battery, as well as the battery terminals, and a multiplexer scans each of the cells and the battery terminals to monitor load current, battery voltage, and the cell voltage of each of the cells. The load bank is continually adjusted to maintain a constant current. The principal control element of the battery analyzer is a microprocessor chip which interrelates with a keyboard for receiving data from an operator. A printer, controlled by the microprocessor, presents a permanent record of the battery analysis, while a display unit, under program control, directs an operator in the use of the analyzer.

14 Claims, 13 Drawing Figures

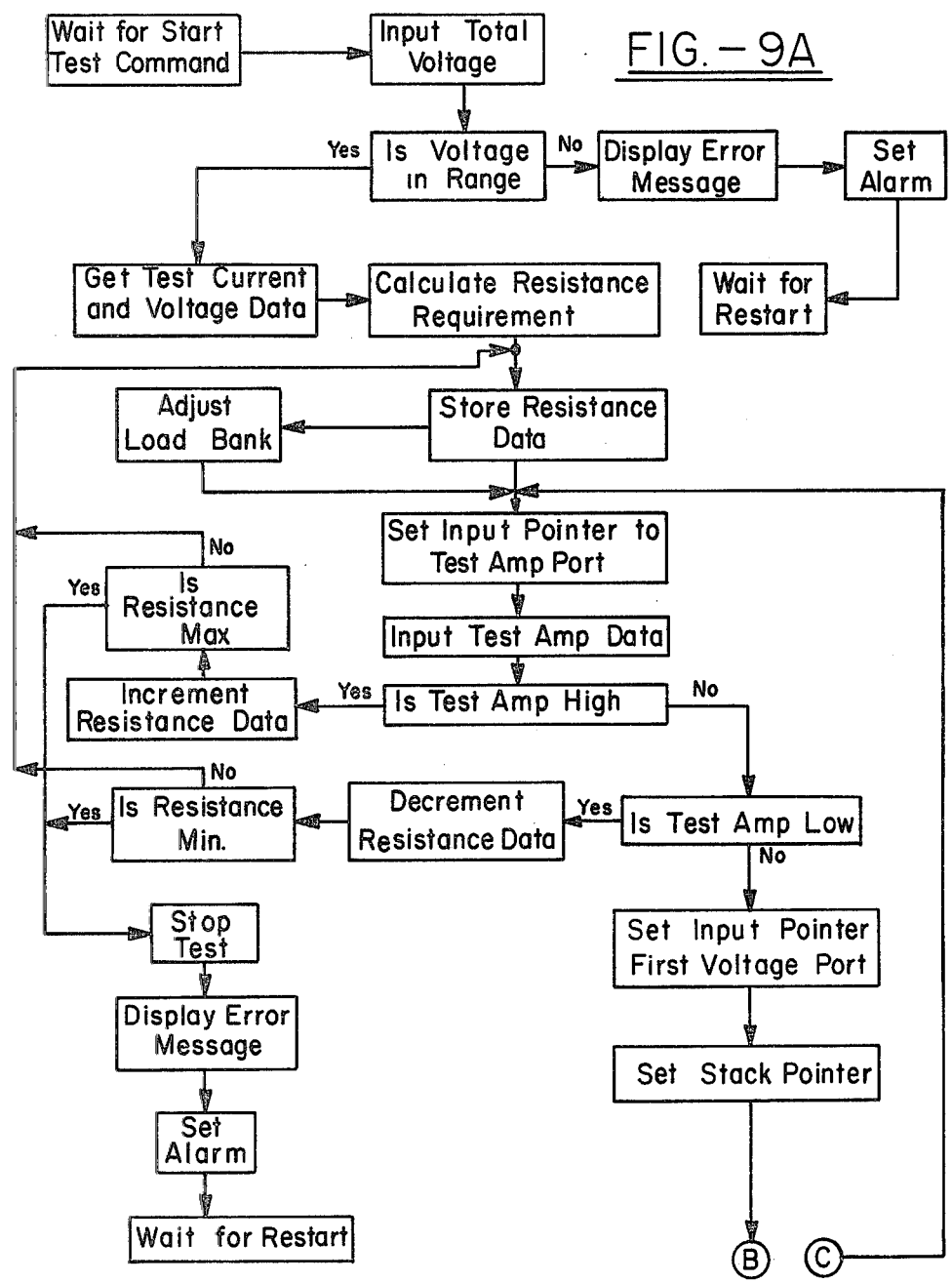
FIG.—9A

BATTERY ANALYZER

BACKGROUND OF THE INVENTION

The invention herein resides in the art of apparatus and techniques for the testing and analyzing of the condition of lead cell acid batteries. Particularly, the invention relates to such apparatus and techniques as are used in servicing heavy-duty industrial batteries of the type conventionally used for operating lift equipment and the like. As is well known in the art, such batteries are quite expensive and require preventive as well as repairable maintenance in order to optimize the effective life of such batteries and to guard against costly failures and down time. Indeed, it is most beneficial if accurate records of battery test results may be maintained such that failures and/or the need for maintenance may be predicted. Any apparatus or technique for testing and analyzing the condition of a battery which will reduce repair and down-time expenses will be of significant benefit to those industries requiring the use of such batteries.

Applicant is aware of the general state of the art of apparatus for monitoring and testing the condition of industrial batteries. While none of the art known to applicant teaches or suggests the structure, technique, and attributes of the invention presented herein, the general state of the art is shown by the following U.S. Pat. Nos.:

| | |
|---|---|
| 2,690,544 | 3,886,447 |
| 2,829,336 | 3,895,284 |
| 3,500,167 | 3,969,667 |
| 3,599,094 | 3,906,329 |
| 3,593,099 | 3,971,980 |
| 3,720,869 | 3,984,762 |
| 3,808,522 | 4,028,616 |
| 3,832,629 | 4,044,300 |
| 3,848,181 | 4,052,717 |
| 3,873,911 | 4,053,824 |
| 3,876,931 | 4,134,060 |

None of the battery testing structures and techniques known to applicant allow for the repetitive testing of each cell of the battery by means of a multiplexing scan technique, the results of each such test being individually recorded and compared against the reference. Further, the known art fails to teach a method and apparatus wherein the battery cells are loaded during the test to achieve a constant current drain, the load being varied with decreasing battery voltage to maintain such drain. Yet further, the art fails to teach the recording of individual cell failures during a prolonged test such that individual cells may be maintained to prolong overall battery life. The art is also devoid of apparatus providing a test print-out for each test so that a permanent record may be maintained for each battery analyzed, facilitating the predicting of problems and enabling timely scheduling of maintenance.

OBJECTS OF THE INVENTION

In light of the foregoing, it is an object of the instant invention to provide a battery analyzer which provides a constant current discharge load for the battery during test.

Another object of the invention is to provide a battery analyzer which includes means for monitoring the cell voltage of each battery cell during the test and to do so at predetermined time intervals.

Still another object of the invention is to provide a battery analyzer which includes means to read and monitor total battery current and voltage during the battery test.

A further object of the invention is to provide a battery analyzer which is programmable, including a display panel having messages thereon for assisting the operator in performing the test.

Yet an additional object of the invention is to provide a battery analyzer which presents a print-out of all pertinent data acquired during the test of the battery.

Still another object of the invention is to provide a battery analyzer which is durable, accurate, and reliable in use, which may be implemented utilizing start-of-the-art elements, and which may be easily operated.

SUMMARY OF THE INVENTION

The foregoing and other objects of the invention which will become apparent as the detailed description proceeds are achieved by apparatus for testing a battery having a plurality of cells, comprising: a load bank for interconnection across the battery and for draining current therefrom; monitor means connected to the battery for measuring the voltage of each of the plurality of cells of the battery and for measuring said current drained by said load bank; and control means interconnected between said load bank and monitor means for regulating said load bank.

DESCRIPTION OF DRAWINGS

For a complete understanding of the objects, technique, and structure of the invention, reference should be had to the following detailed description and accompanying drawings wherein:

FIG. 3, comprising

FIG. 9, comprising FIGS. 9A and 9B, is a flow chart of the test program of the invention.

DETAILED DESCRIPTION OF PREFERRED EMBODIMENT

Figure 1:
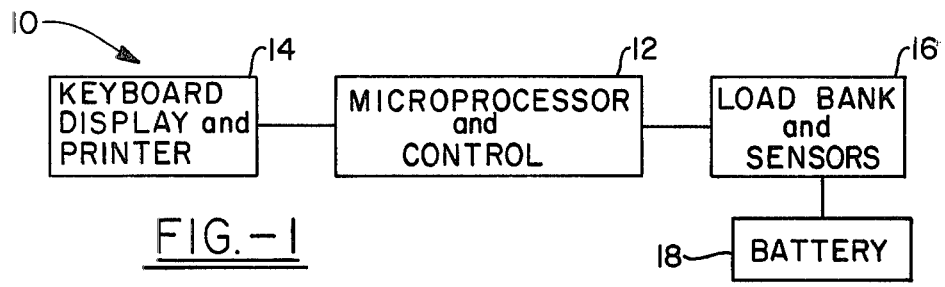
FIG. 1 is a block diagram of the basic structure of the invention.

Referring now to the drawings and more particularly to FIG. 1, it can be seen that a battery analyzer system according to the invention is designated generally by the numeral 10. The system 10 includes a microprocessor and control circuit 12 which communicates with input/output circuitry 14 comprising a keyboard, display panel, and printer. The keyboard allows for the submission of data by an operator to the microprocessor and control circuit 12, while the display provides a means for visual communication from the microprocessor to the operator. Data entered via the keyboard is also presented on the display for observation. Finally, the printer is provided for maintaining a permanent record of the data entered by the operator respecting the particular battery and the data obtained from that battery during test.

The microproessor 12 also communicates with a load bank 16 which is interconnected with the battery 18 to be tested. The load bank comprises a plurality of resistors, selectively interconnected with the battery 18 to maintain a constant current load during the test. The circuitry 16 also includes a plurality of sensors in intercommunication between the battery 18 and microprocessor 12 to communicate data respecting the condition of the battery and cells during test.

Figure 2:
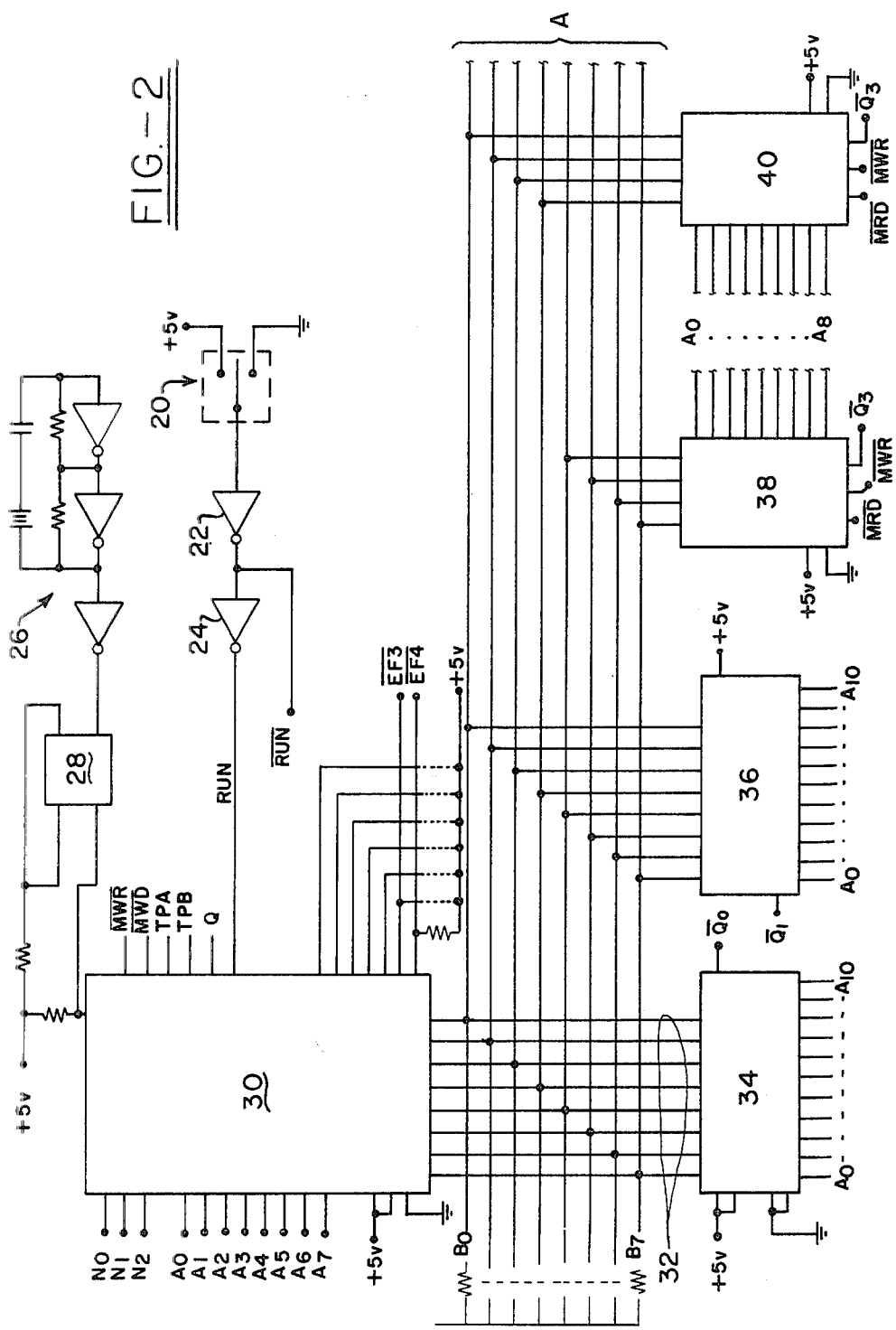
FIG. 2 is a circuit schematic of the microprocessor chip and memory arrays utilized in the structure of the invention.

As illustrated in the schematic of FIG. 2, a reset or initialization switch 20 is provided in interconnection with inverting drivers 22,24. The outputs of these drivers designated RUN and $\overline{RUN}$, are utilized for initializing or resetting the microprocessor, registers, flip-flops and the like to be discussed hereinafter. The switch 20 may also be used for aborting any process in which the system 10 is engaged, resetting the system to begin operations anew.

A crystal oscillator clock circuit 26 operates in standard fashion to produce a square wave output of characteristic frequency. The output of the crystal oscillator 26 is applied to a divider 28 to provide the basic clock control pulse to the microprocessor chip 30. While any of various microprocessors might be utilized in the structure of the invention, it is preferred that the chip 30 be of the model CDP 1802, manufactured by RCA. This chip and the programming thereof is described in "User Manual for the CDP 1802 Cosmac Microprocessor," copyrighted in 1977 by RCA Corporation. The microprocessor chip 30 communicates with the various elements to be discussed hereinater by means of the bidirectional input/output lines 32.

Associated with the microprocessor 30 and communicating therewith by means of the input/output lines 32 are a series of memory chips 34–40. Read only memories 34,36 are of the standard EPROM type and are used for maintaining the basic control program to be utilized by the system 10. In standard fashion, such program is "burned" into the chips 34,36. Also provided as part of the memory of the microprocessor system are random access memories 38,40 which are utilized for temporary storage of data and results of arithmetic calculations during the system's programmed routine. Indeed, the memories 38,40 operate in standard fashion as "scratch pad" memories.

With particular reference to the microprocessor chip 30, it will be seen that a plurality of output address lines A0–A7 are provided in communication with the address input lines of the memories 34–40. In standard fashion, these address lines access the various storage bits of the memories under program control. The output address lines of the microprocessor 30 are also applied to various other elements to be discussed hereinafter for accessing or selecting various chips or elements. Outputs N0–N2 are used as selective outputs to select various registers, buffers, or the like to be discussed hereinafter. The signals $\overline{MWR}$ and $\overline{MRD}$ comprise the memory write and memory read pulses, respectively, which are applied to the random access memories 38,40 to control whether a write or read operation is being performed. Timing pulses TPA and TPB are used for strobing control of various other circuit elements which will be described hereinafter. The output Q of the microprocessor 30 is used for actuating an alarm as shown in FIG. 3D and which will be discussed hereinafter. Finally, the inputs $\overline{EF3}$ and $\overline{EF4}$ are respectively used for informing the microprocessor that a key has been depressed and that the printer is ready to accept data.

FIG. 3 presents the circuitry which generates the signals for accessing or enabling either of the read only memories 34,36 or the random access memories 38,40. As shown, the address lines A0–A5 of the microprocessor 30 are provided as inputs to a decoder 42 to selectively actuate the two output lines thereof shown as interconnected with the one of four decoder 44. As shown, the decoder 42 is reset or enabled by the RUN signal, with the output, correlating to the inputs A0–A5, being set upon receipt of the timing pulse TPA. Effectively then, the outputs of the one of four decoders 44, $\overline{Q0}$, $\overline{Q1}$, and $\overline{Q3}$, are selected by the microprocessor 30 with the first two signals respectively accessing the read only memories 34,36, and the last such signal accessing the random access memory 38,40. The decoder 42 also generates the address lines A8–A10 from the state of A0–A5 on receipt of a TPA pulse.

Figure 3A:
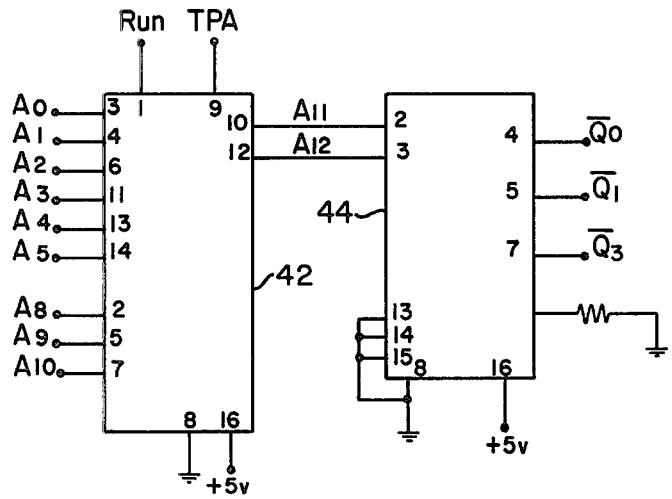
FIGS. 3A–3D, are circuit schematics of decode circuitry for interconnection between the microprocessor chip and addressable circuit elements, and further presents the alarm circuitry for actuation by the microprocessor.
Figure 3B:
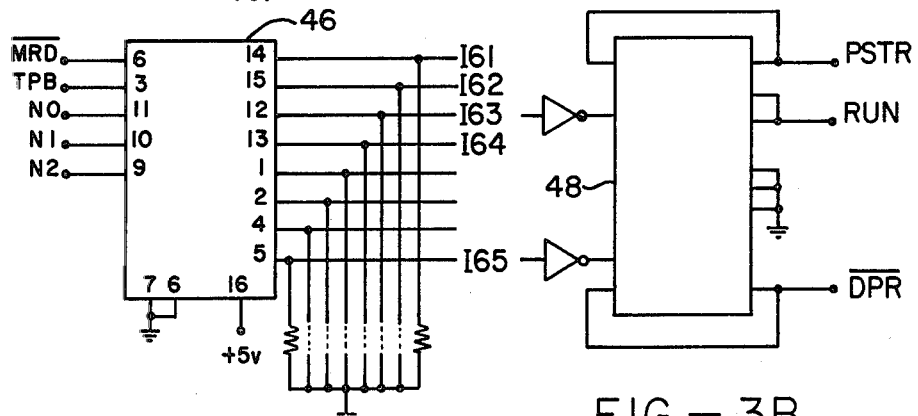
Figure 4:
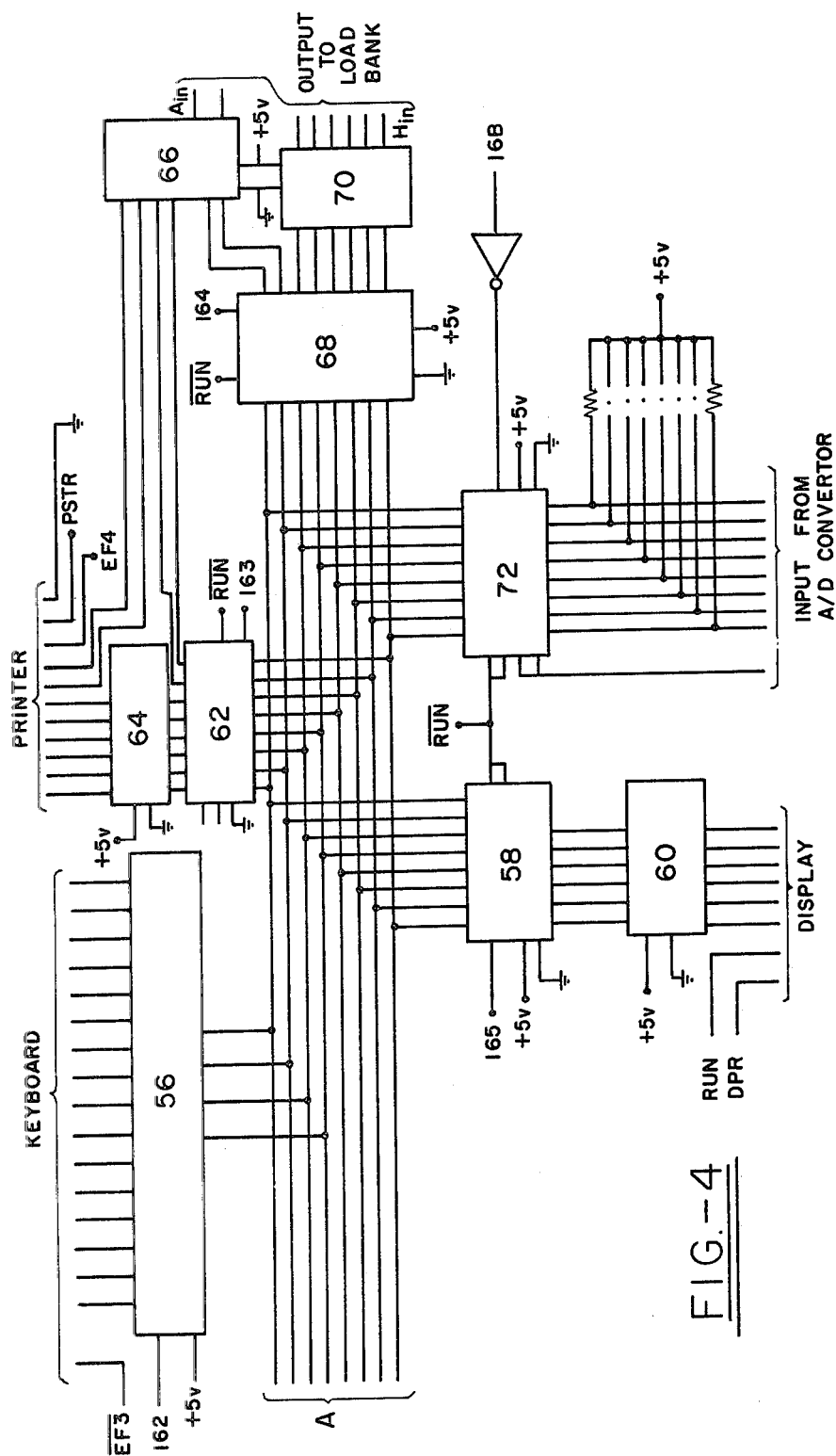
FIG. 4 is a circuit schematic of the keyboard, printer, display, and load bank control circuitry.

In FIG. 3B, the circuitry for generating additional control signals is presented. As shown, a decoder 46 generates control signals I61–I65 with the control signals I63 and I65 being passed to the dual D-type flip-flop 48 for generation of yet additional control signals. The decoder 46 receives as inputs thereto the control signals N0–N2 from the microprocessor 30 as well as the timing pulse TPB and the memory control signals $\overline{MRD}$. The outputs of the decoder 46 are used for selecting for actuation various of the other circuit elements, as best shown in FIG. 4 and to be described hereinafter. The flip-flop 48, reset by the $\overline{RUN}$ signal, presents the printer strobe signal $\overline{PSTR}$ and the display strobe $\overline{DPR}$, indicating that data is present at the display.

Figure 3C:
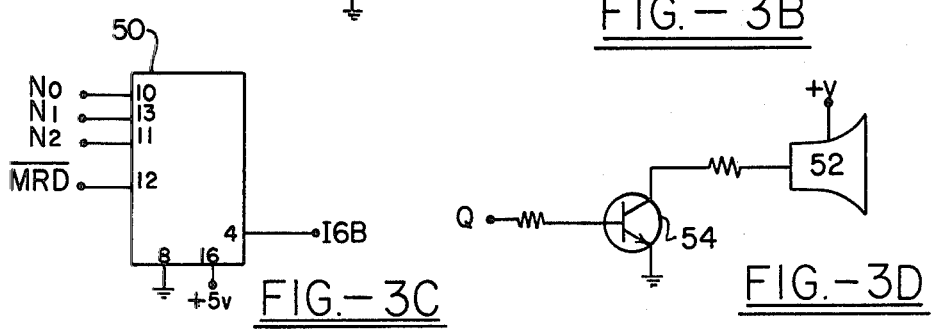
Figure 3D:
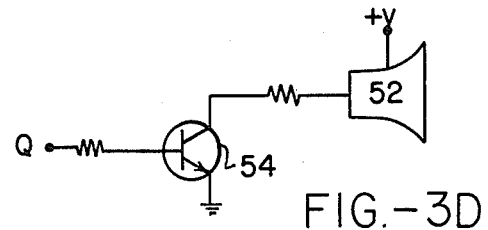

With brief attention to FIG. 3C, it can be seen that a decoder 50, receiving control signals N0–N2 and $\overline{MRD}$ from the microprocessor 30, generates the control signal I6B which is used for enabling a latch in FIG. 4, again to be discussed hereinafter. At this point in time, it need only be appreciated that the circuitry of FIGS. 3A–3C receive address and control signals from the microprocessor 30 and, by appropriate decode circuitry, present output signals which are applied to selected latches, buffers, registers, and the like for enabling those elements to receive or transfer data.

With final brief attention to FIG. 3D, it should be noted that a horn or alarm 52 is operatively connected to the output Q of the microprocessor 30 for energization when a predetermined test failure has occurred. Of course, the Q output is energized under program control, sensing such failure. In any event, as shown in FIG. 3D, the Q output gates the transistor 54 into conduction, turning on the alarm 52, which alarm may comprise either audible or visual indicia of the test failure.

Attention now is directed to FIG. 4 wherein certain of the operational control circuitry of the invention is illustrated in interconnection between the keyboard, printer, display, and load bank. As shown, the keyboard is controlled by the microprocessor 30 through the latch and 16-bit decoder 56. The four input lines to the decoder 56 select one of the sixteen output lines thereof, each such line connected to a key of the keyboard. The other side of each key is connected to the line $\overline{EF3}$. Accordingly, as the microprocessor 30 scans the keyboard by means of the sixteen possible combinations of the four input lines, it searches for a response on the line $\overline{EF3}$ with such response, timed with the state of the four input lines, advising the microprocessor 30 as to states of actuation of the keys of the keyboard. Further, and as is well known to those skilled in the art, the line $\overline{EF3}$ may also be programmed to respond only to a valid programmed response. In any event, the interrelationship between the keyboard and the microprocessor 30 is of the state of the art, and is not further elaborated upon herein. It should be briefly noted that the control signal I62, from the decoder 46, enables or selects the latch and 16-bit decoder 56 for response.

An LED display such as that manufactured by Burroughs Corporation and described in Bulletin No. 3004B, dated March 1975, is utilized for displaying messages, under program control, to the operator and for further displaying data entries made via the keyboard. The data is transferred through the display by means of a latch 58 and a hex buffer 60. The latch 58 is actuated by the I65 control pulse, while the data is transferred to the display upon presentation of the $\overline{DPR}$ pulse. Of course, the display is cleared or initialized by the RUN signal, while the latch 58 is reset by the $\overline{RUN}$ signal.

As noted in FIG. 1, a printer is also provided for presenting a paper tape output of the data entered or acquired during the battery test. The printer may be of any suitable nature, but is preferably of the type described in "Model 6400 Series Alphanumeric Printers," by Digiter Instrumentation, publication No. 8806400 BK379R5BP. Data is transmitted to the printer under control of the microprocessor 30 through a dual 4-bit latch 62 and the buffers 64,66. The latch 62 is reset by the $\overline{RUN}$ signal and is gated to receive data from the data BUS under control of the signal I63. The printer, of the nature just discussed, communicates with the microprocessor 30 by the $\overline{EF4}$ line and is enabled to receive data from the buffers 64,66 by the $\overline{PSTR}$ output of the circuit 48.

Also receiving data from the data BUS is a dual 4-bit latch 68 which, through the buffers 66,70, transfers data to the load bank of FIG. 7 to be discussed hereinafter. Suffice it to say that the outputs of the buffers 66,70 control the load connected to the battery during test; the outputs Ain-Hin controlling the selective gating of resistors into parallel interconnection in the load configuration. As will be noted, the latch 68 is controlled by the signal I64 for receiving data from the data BUS and is operatively reset by the $\overline{RUN}$ signal.

With final attention to FIG. 4, it can be seen that a latch 72 is provided for receiving data from the battery cells via the cicuitry of FIG. 5, to be discussed hereinafter, and to transmit that data to the data BUS for processing and storage via the microprocessor and random access memories 38,40. The latch 72 is, as shown, controlled by the I6B signal from the decoder 50, under program control.

Figure 5:
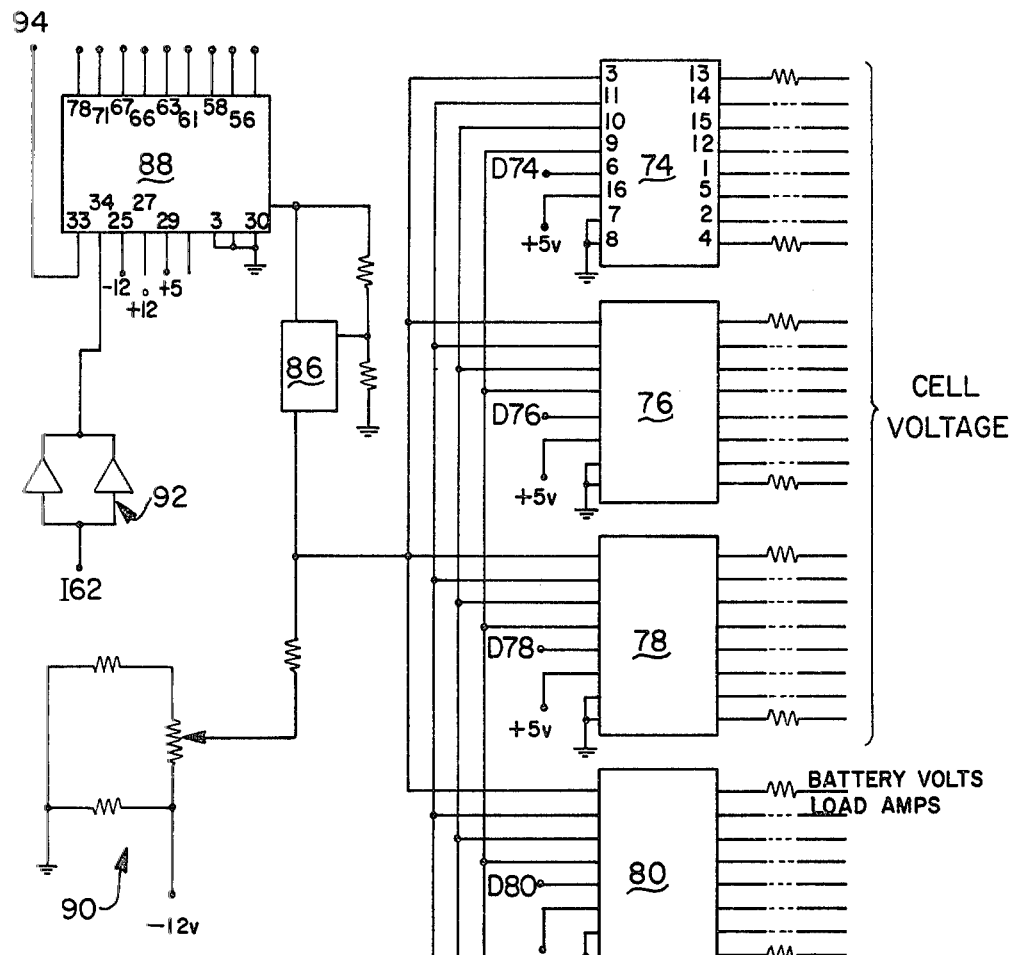
FIG. 5 is a circuit schematic of the multiplexing circuitry utilized for scanning the various battery cells and the analog-to-digital converter of the same.

In FIG. 5 there is shown the circuitry utilized for interconnection with the battery under test for sensing the voltage and current data relative to the test and for transmitting that data through the latch 72 to the data BUS. As shown, one of eight data selectors 74–80 are provided with their inputs adapted for interconnection with the battery. The twenty-four inputs of the data selectors 74–78 are each adapted for unique interconnection with one of the battery cells of the battery 18 under test. Accordingly, the system of the preferred embodiment of the invention may receive voltage readings from a battery having up to twenty-four cells. Of course, by the addition of further data selectors or by utilization of unused inputs of the selector 80, a larger number of cells could be accommodated. It will be understood that each of the inputs to the selector 74–80 would be connected to a plug, for mating engagement with jacks connected as by alligator clips or the like to the various cells.

The data selector 80 is utilized for sensing the total voltage across the battery under test with another input thereof sensing the current being drained by the load from the battery. The structure of such interconnections will become apparent with respect to FIG. 7.

Figure 6:
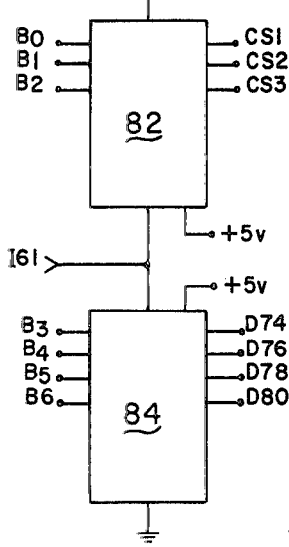
FIG. 6 is a circuit schematic of the decode circuitry for controlling the multiplexing of the circuitry of FIG. 5.

With reference to FIG. 6, and continued reference to FIG. 5, it can be seen that the selection of particular data selectors 74–80 and of the specific inputs thereof is under control of the decoder comprising the latches 82,84. These latches are activated by the I61 pulse from the circuit 46 to activate the outputs thereof in accordance with the state of the inputs. These inputs, labeled BO-B6, are respective ones of eight data BUS lines connected to the input/output lines 32 of the microprocessor 30. The outputs of the latch 82, CS1-CS3, are applied to the decoded inputs of the data selectors 74–78 for selecting one of the eight inputs thereof. The particular data selector 74–80 which will respond to the outputs of the latch 82 is determined by the state of the outputs of the latch 84. As shown, the four outputs of the latch 84, D74-D80, are mutually exclusively connected to associated enabling inputs of the data selectors 74–80. Accordingly, the microprocessor 30, by presenting appropriate signals on six lines of the data BUS may, upon the occurrence of an I61 pulse, select a particular one of the inputs of the data selectors 74–80 to be passed through the operational amplifier 86 to the analog digital converter 88. A tuning circuit 92 is provided in standard fashion with the operational amplifier 86, as is the feedback circuit shown.

It will be appreciated that the data selectors 74–78 act merely as switches, actuated by the decode circuitry of FIG. 6, to pass battery data, either cell voltage, battery voltage, or load current, through the operational amplifier 86 and to the A/D converter 88. The converter 88, upon receipt of an I62 signal through the drivers 92, receives the analog input from the amplifier 86, and upon completion of the digitizing thereof presents a signal over the line 94 to enable the latch 72 to receive the digitized data for application to the data BUS.

Figure 7:
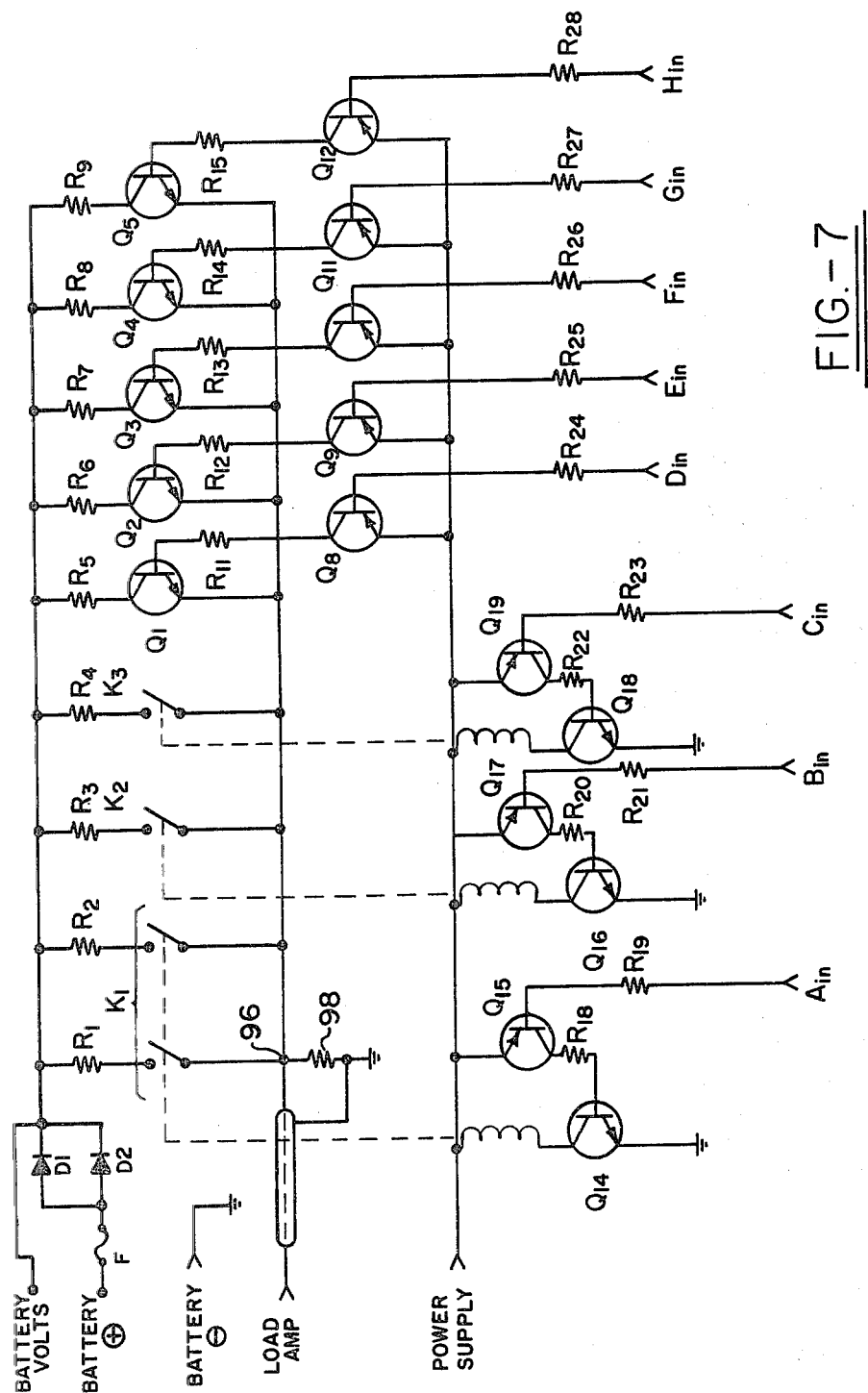
FIG. 7 is a circuit schematic of the load bank controlled by the circuitry of FIG. 4.

The load bank utilized for applying a constant current drain to the battery 18 is illustrated in FIG. 7. As shown, the positive terminal of the battery is connected, as by a clamp or the like, through a fuse F1, through diodes D1,D2, to a plurality of resistors R1-R9 for selective interconnection with ground. Of course, the negative battery terminal is connected to ground as shown. The diodes D1,D2 are interposed for purposes of preventing reverse polarity interconnection with the battery 18. On the opposite side of the diodes from the point of interconnection with the battery, the battery voltage signal is fed back to an input of the selector 80 of FIG. 5, maintaining thereat a signal indicative of the instantaneous battery voltage at any point in time.

It is an object of the invention that the load current or the current drained from the battery 18 during the test remain constant. Since the battery voltage will be constantly changing, generally decreasing, the load resistance must, of necessity, also change in accordance with the rule $V=IR$. To this end, the resistors R1-R9 are controlled by switching devices such as transistors or relays for selective inclusion into the load, the inclusion being dependent upon the states of the control signals Ain-Hin. These control signals are provided from the buffers 66,70 as discussed with respect to FIG. 4, with the states thereof being under program control.

It will be readily appreciated by those skilled in the art that when Ain is at a low level, the transistor Q15 conducts, closing the contacts of the relay K1 via conduction of the transistor Q14. In this situation, the resistors R1 and R2 are in parallel connection in the load bank. The same situation is generally true for the resistors R3 and R4 respectively controlled by the input signals Bin and Cin. The resistor R5 is placed into the circuit when the signal Din is low, allowing the transistor Q8 to turn the transistor Q1 into conduction, interconnecting the resistor R5 between the battery and ground. The same general operation is true for resistors R6-R9 with associated input signals Ein-Hin. As is well known to those skilled in the art, as additional resistors are placed into parallel connection with those already in the load bank, the effective resistance will decrease to maintain a constant current for a decreasing voltage. Of course, the values of the resistors R1-R9 may be tailored such that fine adjustment of the effective resistance may be achieved by proper control of the inputs Ain-Hin.

All of the current through the resistors R1-R9 is summed at the node 96 and passed through the current shunt resistor 98 to ground. To this end, it will be appreciated that the voltage at the node 96 is indicative of the current at that point and, accordingly, the total current being drawn from the battery 18. This voltage signal from the node 96, equated to load current, is applied to the appropriate input of the data selector 80 as discussed in FIG. 5. This signal is used under program control to adjust the inclusion or exclusion of resistors R1-R9 in the effective load bank to maintain the constant current desired.

The elements used in construction of the circuitry of the invention comprise the state of the art, and the selection of suitable circuit elements for construction of the invention is believed to be within the ability of those skilled in the art. For example, circuit chip selection can be made from those presented in "RCA COS/MOS Integrated Circuits," copyrighted by RCA Corporation in 1977. The A/D converter 88 may be of the nature described in "General Purpose Analog-to-Digital Converters," published by Datel Systems, Inc., of Canton, Mass., in Oct. 1977.

Figure 8:
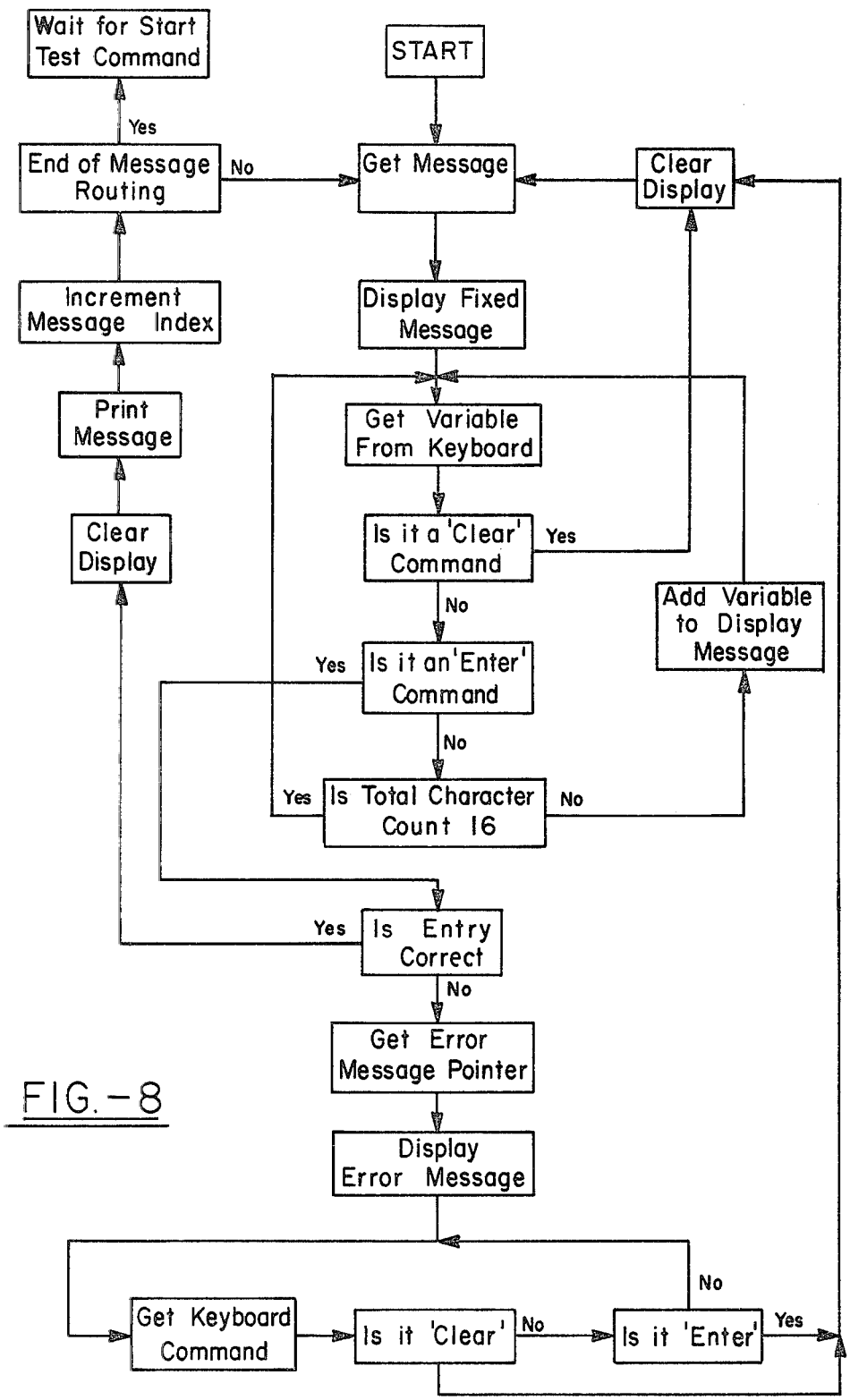
FIG. 8 is a flow chart of the initialization program for operation of the invention.

The operation of the invention in conducting tests on industrial batteries is achieved, in part, by the programming of the microprocessor chip 30, as stored in the read only memories 34,36. An appreciation of the testing operations of the invention may be had from a review of the program flow charts of FIGS. 8 and 9. The former flow chart presents the technique by which data is entered from the keyboard to prepare the system 10 for the test, while the chart of FIG. 9 outlines the specific steps of the test.

Figure 9B:
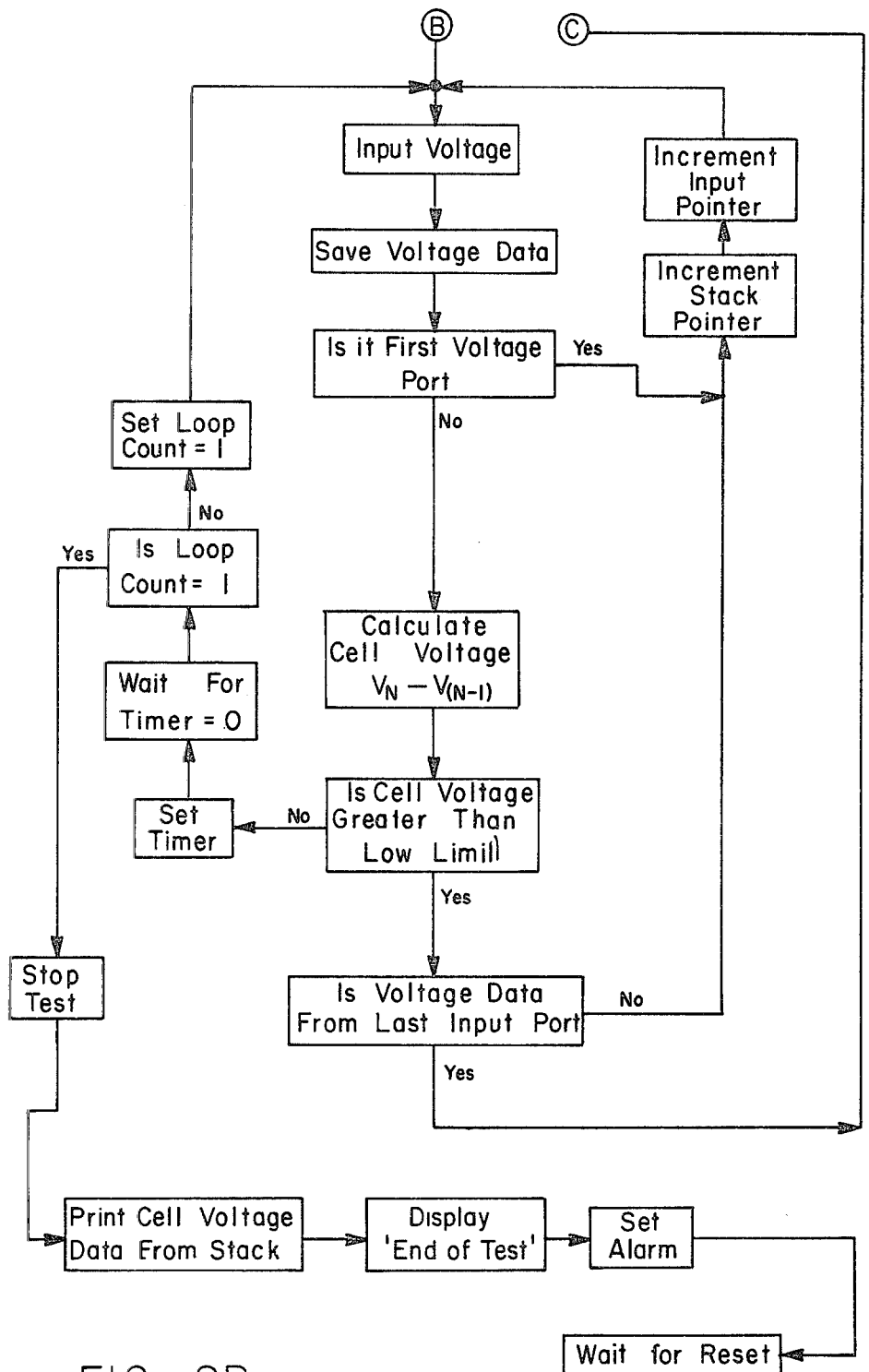

With particular reference to FIG. 9, it will be noted that the beginning of the testing operation is at the start command at which time the switch 20 of FIG. 2 is actuated and the resetting signals RUN and $\overline{RUN}$ are presented. The microprocessor then seeks its first message pointer and displays a fixed message on the LED display unit. This message may request the operator to enter such data as the date, the battery or operator identification number, the voltage of the battery, the ampere/hour rating of the battery, the load current for the test, the number of scans and data samples to be taken per hour, and the voltage limit for the test. It will be understood that the voltage limit is that voltage to which a cell will be allowed to drop to conclude the test. Of course, any of various messages may be printed on the display, requesting entries from the keyboard.

The operator responds to the displayed message by entering data via the keyboard which is scanned by the microprocessor 30 in the manner discussed above. The microprocessor obtains the variable from the keyboard and first determines if a clear or enter command has been actuated. In the case of a clear command, the display is cleared and the message pointer is reacquired. If neither the enter nor clear commands have been actuated, a determination is made as to whether or not the total number of characters entered on the keyboard has reached sixteen, the register limit for the display. If the count has not reached sixteen, the variable is added to the display message as shown, whereas, if the total character count equals sixteen, then no further entries may be made to the register or display.

When an enter command has been actuated, a determination is made as to whether or not the entry is correct. For example, the load current selected for the test must be within appropriate limits with respect to the ampere/hours entered. If the entry is a correct one, the display is cleared, the message is printed on the printer and entered into memory, the message index is advanced, and a determination is made as to whether or not the response is being made to the last message. If other messages are to follow, the program loops as shown. Upon responding to the last message and entering that response, the microprocessor goes into an idle loop, awaiting a start command for the test.

If the entry made in response to a message was incorrect, the microprocessor obtains an error message pointer and, on the display, presents the appropriate error message. The system then looks to the keyboard for a command with either a clear or enter command clearing the display and reobtaining the message.

With reference to FIG. 9, an appreciation of the test procedure of the battery may be had. When the test command is given, the battery senses the total battery voltage and determines whether or not the voltage is within an appropriate range of the battery voltage entered via the keyboard in the flow chart of FIG. 8. If the voltage is out of range, most probably indicating that improper parameters were entered via the keyboard, an error message is displayed, the alarm 52 is excited, and the system goes into a hold pattern awaiting a restart signal.

If the voltage sensed via the data selector 80 is within range, the test load current and the battery voltage are obtained from the information presented through the keyboard and the mathematical calculations are made to determine the resistance necessary from the load bank of FIG. 7. This resistance data is entered into memory and the load bank is adjusted by the microprocessor through the latch 68 and buffers 66,70. The input port of the data selector 80 presenting data relative to the load current is then selected and the load current is sensed. If the load current is found to be too high, the resistance is incremented, whereas if the load current is too low, the resistance is decremented. Such procedure is followed until the selected load current is achieved. However, if such adjustment requires that the resistance exceed a maximum value or drop below a minimum value, the test is stopped, an error message is displayed, the alarm 52 is excited, and the system awaits restart.

If the desired test amperage is achieved, the input pointer is directed to the first voltage port, attached to the first battery cell, as accessed via the first channel of the data selector 74. The stack pointer is then set to direct data to the random access memory 38,40, and the cell voltage is sensed and converted to a digital value via the converter 88. This data is then stored in the random access memory and a determination is made as to whether or not this was the first cell sensed. If it is the first cell, the input and stack pointers are incremented and data respecting the value of the second cell is stored in a second portion of the RAM memory. After at least the first two cells have been scanned, the cell voltage may be calculated by subtracting subsequent voltage readings from immediately preceding voltage readings, the differential being the cell voltage. With the cell voltage calculated, a determination is made as to whether or not the cell voltage is greater than the load limit established by the voltage limit entered by the keyboard in preparation for the test. If it is, a determination is then made as to whether or not the last cell has been tested and, if not, the stack and input pointers are advanced and the next cell is tested in the manner just described. This testing continues until the last cell has been tested, in which case the program cycles back to where adjustment of load current is made and the system awaits its next cell scan cycle.

If the cell voltage of any cell drops below the selected voltage limits, a timer is set for a period of time sufficient to allow the cell voltage to stabilize. The program then sets the loop count equal to one, and passes through the test cycle again. If the cell voltage is still below the low limit on the second pass through the test, the test is terminated because the loop counter has already been set. The cell voltage and the elapsed test time are then printed via the printer. The display registers that the test has ended, and the alarm 52 is set. The system then awaits resetting and starting of a new test operation.

Thus it can be seen that the structure and technique of the invention allows a battery to be tested under a constant current load and under operator selected test parameters. The system includes a printer for providing a permanent record of valuable data respecting the battery tested and, indeed, respecting the individual cells thereof. The time of failure of a cell and the voltage level at which the cell failed may be recorded for future preventive maintenance or anticipatory removal from service. Indeed, when a cell fails a test, that cell may be immediately replaced, the battery recharged, and the test run again to determine satisfactory battery condition.

While in accordance with the patent statutes only the best mode and preferred embodiment of the invention has been presented and described in detail, it is to be understood that the invention is not limited thereto or thereby. Accordingly, for an appreciation of the true scope and breadth of the invention, reference should be had to the following claims.

What is claimed is:

1. Apparatus for testing a battery having a plurality of cells, comprising:
   a load bank for interconnection across the battery and for draining current therefrom;
   monitor means connected to the battery for measuring the voltage of each of the plurality of cells of the battery and for measuring said current drained by said load bank;
   control means interconnected between said load bank and monitor means for regulating said load bank; and
   wherein said monitor means comprises a multiplexer connected to each of the cells of the battery and mutually exclusively accessing each of such cells for receiving a cell voltage therefrom.

2. The apparatus according to claim 1 wherein said monitor further includes an analog-to-digital converter, receiving and digitizing the cell voltages and transmitting the same to said control means.

3. The apparatus according to claim 2 wherein said multiplexer is further connected across terminals of the battery and receives therefrom signals corresponding to the voltage of the battery and said current drained by said load bank.

4. The apparatus according to claim 1 wherein said load bank comprises a plurality of resistors in selective parallel interconnection.

5. The apparatus according to claim 4 wherein said control means comprises a plurality of switching circuits connected to said resistors, said switching circuits selectively interconnecting said resistors.

6. The apparatus according to claim 1 which further includes input means connected to said control means for transmitting data respecting the battery to said control means.

7. The apparatus according to claim 1 which further includes output means connected to said control means for receiving data from said control means respecting the battery and recording the same.

8. The apparatus according to claim 1 wherein said control means is further operative for comparing the voltage of each of the battery cells against a reference and energizing an alarm when the voltage of any cell drops below said reference.

9. A battery analyzer for testing a multicell battery under load, comprising:
   a load bank for connection across the battery, said load bank comprising a plurality of resistors in selective interconnection with each other;
   a sensor connected to terminals of the battery and across each of the cells thereof;
   a multiplexer connected to said sensor, said multiplexer mutually exclusively accessing the cells and terminals of the battery and receiving therefrom signals corresponding to cell voltage, battery voltage, and the current passing through said load bank; and
   control means interconnected with said load bank, sensor, and multiplexer, for maintaining said current at a constant level.

10. The battery analyzer according to claim 9 wherein said control means further compares the signals corresponding to cell voltage to a predetermined level and records the location of the cell first having a voltage below such level.

11. The battery analyzer according to claim 10 which further includes an alarm connected to and actuated by said control means when the voltage of a cell drops below said level.

12. The battery analyzer according to claim 9 which further includes a printer connected to said control means, said printer providing a record of data respecting the battery.

13. The battery analyzer according to claim 12 which further includes a keyboard for transmitting data to said control means.

14. The battery analyzer according to claim 13 which further includes a visual display connected to said control means, said display presenting requests to an operator for data to be entered from the keyboard.

* * * * *